United States Patent [19]
Chen et al.

[11] Patent Number: 4,882,649
[45] Date of Patent: Nov. 21, 1989

[54] NITRIDE/OXIDE/NITRIDE CAPACITOR DIELECTRIC

[75] Inventors: Ih-Chin Chen, Dallas; Bing W. Shen, Richardson; Robert R. Doering, Plano, all of Tex.

[73] Assignee: Texas Instruments Incorporated, Dallas, Tex.

[21] Appl. No.: 174,751

[22] Filed: Mar. 29, 1988

[51] Int. Cl.$^4$ .................... H01G 7/00; H01G 4/06; H01L 29/34
[52] U.S. Cl. ..................... 361/313; 29/25.42; 357/54
[58] Field of Search ............ 29/25.42, 570.1; 357/23.6, 91, 51, 54; 361/311–313, 320, 321, 433 S, 433 C, 433 A

[56] References Cited

U.S. PATENT DOCUMENTS

| | | | |
|---|---|---|---|
| 3,113,253 | 12/1963 | Ishikawa et al. | 361/313 |
| 4,360,900 | 11/1982 | Bate | 357/23.5 X |
| 4,472,726 | 9/1984 | Di Maria et al. | 357/6 |
| 4,621,277 | 11/1986 | Ito et al. | 357/54 |
| 4,623,912 | 11/1986 | Chang et al. | 357/54 |
| 4,630,086 | 12/1986 | Sato et al. | 357/54 X |
| 4,635,090 | 1/1987 | Tamaki et al. | 357/54 X |

OTHER PUBLICATIONS

IEEE Electron Device Letters, vol. EDL-7, No. 6, Jun. 1986, pp. 365 to 367.
Yau, "Determination of the Fowler-Nordheim Tunneling Barrier from Nitride to Oxide in Oxide: Nitride Dual Dielectric".
Yau et al., "Effects of Barrier Asymmetry on the Electrical Properties of Thin Oxide: Nitride Dielectrics," *International Symposium on VLST Technology, Systems and Applications*, Taipei, Taiwan (May 1985), pp. 295–299.
Di Maria et al., "Charge Transport and Trapping Phenomena in Off-Stoichiometric Silicon Dioxide Films," J. Appl. Phys. 54(10), (Oct. 1983), pp. 5801–5827.
Di Maria et al., "Electron Heating in Silicon Dioxide and Off-Stoichiometric Silicon Films," J. Appl. Phys. 57(4) (Feb. 1985), pp. 1214–1238.

*Primary Examiner*—Donald A. Griffin
*Attorney, Agent, or Firm*—Rodney M. Anderson; Melvin Sharp

[57] ABSTRACT

An integrated circuit capacitor is disclosed which has improved leakage and storage characteristics. The dielectric material for the capacitor consists of a first layer of silicon nitride adjacent the lower plate, such as a silicon substrate, upon which a layer of silicon dioxide is formed. A second layer of silicon nitride is formed over the silicon dioxide layer, above which the second plate is formed. The layer of silicon dioxide may be formed by the partial oxidation of the first silicon nitride layer. The capacitor may be a planar capacitor, may be formed in a trench, or may be formed between two layers above the surface of the substrate.

9 Claims, 3 Drawing Sheets

NITRIDE/OXIDE/NITRIDE CAPACITOR DIELECTRIC

This application is in the field of integrated circuits, and is more specifically directed to dielectric materials for semiconductor capacitors.

BACKGROUND OF THE INVENTION

An evolutionary trend in the field of integrated circuits is to reduce the size of the individual components of the circuits. Such reduction in the size of the components provides for lower cost manufacture due to smaller chip size and increased yield, as well as improved circuit performance in many instances.

However, certain limitations in the size reduction of integrated circuit elements are present. For example, conventional dynamic random access memories (DRAMs) use a memory cell consisting of a single capacitor and a single pass transistor for selectively connecting one plate of the capacitor to a bit line for communication of the charged or uncharged state of the capacitor to the sensing circuitry. Reduction in the size of the storage capacitor will necessarily reduce the capacitance thereof, and reduce the amount of charge which may be stored thereupon for a given bias voltage. In the DRAM application, however, the charge stored by an individual memory cell must be maintained at as large a value as possible, in order for the DRAM to tolerate causes of "soft" errors, i.e., data loss, due to the impingement of alpha particles and other charged particles upon the memory device In order to maintain the storage capacitance when the capacitor surface area is reduced, various techniques such as reduction of the dielectric thickness, and increase of the bias voltage have been used. However, the reliability of the storage capacitor is adversely affected by either of such techniques, as tunneling of the stored charge increases directly with the applied voltage and inversely with the thickness of the dielectric.

Another technique for increasing the capacitance of a storage capacitor is to use dielectric materials with high dielectric constants. Tantalum pentoxide ($Ta_2O_5$) is an example of such a material, as its dielectric constant of 22 is five times higher than that of silicon dioxide, which is a conventional storage capacitor dielectric. However, $Ta_2O_5$ is not a compatible material for the manufacture of modern integrated circuits, as it tends to crystallize, resulting in increased leakage, at a relatively low temperature for modern integrated circuit processing.

Composite dielectrics have also been evaluated for use as capacitor dielectrics. Referring to FIG. 1, a common composite dielectric for a capacitor 2 is shown. In such an arrangement, a layer 10 of of silicon dioxide is grown or deposited on substrate 2, and a layer 12 of silicon nitride is deposited thereupon. Gate electrode 14, of a material such as polycrystalline silicon, is then deposited on top of nitride layer 12. Patterning and etching of the layers 10, 12 and gate electrode 14 may be done in the same operation, or may be done individually prior to deposition of the other overlying layers, or in any of a number of well known techniques. Capacitor 2 so constructed has an improved capacitance due to the increased dielectric constant of the composite film (containing both nitride and oxide) as compared with the dielectric constant of a silicon dioxide film alone.

However, a composite film such as that shown in FIG. 1 has been found to have asymmetric I-V leakage characteristics, which is undesirable for integrated circuit applications such as DRAM storage capacitors or electrically programmable read only memory (EPROM) storage cells. As described in "Determination of the Fowler-Nordheim tunneling barrier from nitride to oxide in oxide: nitride dual dielectric," by L. D. Yau, *IEEE Elec. Dev. Lett.*, EDL-7, no. 6, p. 365 (IEEE, June 1986), with gate electrode 14 biased negatively relative to substrate 8, the plate-to-plate leakage of capacitor 2 is much less than with gate electrode 14 biased positively relative to substrate 8. FIG. 2 illustrates the energy band diagram for capacitor 2 of FIG. 1. As described in the Yao et al. paper, with a positive bias on gate electrode 14 relative to substrate 8, the leakage of capacitor 2 is substantially the same as for a capacitor having only a silicon dioxide dielectric. This is because the source of the electrons (substrate 8) is the same in either case, and since the electrons that tunnel through the oxide layer 10 will conduct through nitride layer 12 to gate electrode 8, due to the smaller energy barrier for conduction through nitride layer 12 relative to oxide layer 10. FIG. 2 illustrates that the energy required for an electron to leave the conduction band of substrate 8 and cross through oxide layer is on the order of 3.1 eV, while only 2.05 eV is required to cross nitride layer 12 from gate electrode 14. Each electron that crosses oxide layer 10 will thus have sufficient energy to reach gate electrode 14, so that nitride layer 12 does not decrease the electron leakage for this bias condition. Accordingly, there is little improvement from a leakage standpoint due to the inclusion of nitride layer 12 in the dielectric of capacitor 2 for the positive bias case.

In the case of a negative bias on gate electrode 14 relative to substrate 8 for capacitor 2 of FIGS. 1 and 2, oxide layer 10 serves to block hole conduction due to its large energy barrier; electron conduction is therefore the primary leakage mechanism for this bias condition. The source for electrons in this bias condition is gate electrode 14. Nitride layer 12 presents a substantial energy barrier (2.05 eV) for electron conduction therethrough, as shown in FIG. 2. This energy barrier serves to reduce the number of electrons reaching oxide layer 10, as only those electrons which have an additional 1.05 eV after crossing nitride layer 12 will reach substrate 8. Nitride layer 12 thus substantially reduces the leakage current in the negative bias condition as compared to the symmetric leakage-bias relationship of a capacitor 2 having a single silicon dioxide dielectric layer, and as compared to the positive bias condition for capacitor 2.

A substantial difference in the leakage current for a given magnitude of applied electric field across the plates of capacitor 2 thus exists between the positive and negative bias conditions. This asymmetry is not desirable for a capacitor which may be subjected to a voltage of either polarity. An example of a capacitor for which good bidirectional leakage performance is necessary is a storage capacitor in a DRAM memory cell, where one of the plates is biased to a midpoint voltage (e.g., $\frac{1}{2} V_{dd}$).

It is therefore an object of this invention to provide a composite capacitor dielectric having symmetric leakage characteristics for either polarity of voltage across the capacitor plates.

It is a further object of this invention to provide such a capacitor having improved leakage characteristics.

It is a further object of this invention to provide such a capacitor which may be fabricated by a process compatible with modern integrated circuit processes.

SUMMARY OF THE INVENTION

Other objects and advantages of the instant invention will be apparent to those of ordinary skill in the art having reference to this specification in conjunction with the drawings.

SUMMARY OF THE INVENTION

The invention may be incorporated into a capacitor dielectric film consisting of a first layer of silicon nitride, upon which a layer of silicon dioxide is grown or deposited, with a second layer of silicon nitride covering the silicon dioxide layer. The nitride-oxide-nitride composite film provides for improved capacitance due to the composite dielectric coefficient of the material, with improved leakage characteristics which are symmetric with the polarity of the bias on the plates.

DETAILED DESCRIPTION OF THE INVENTION

Figure 3:
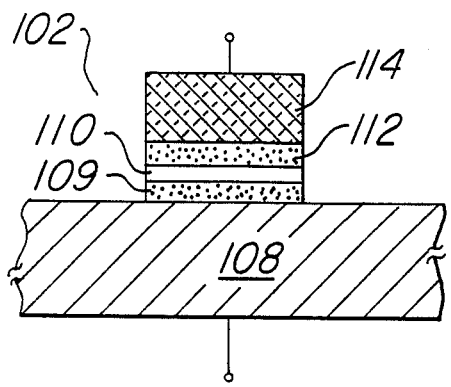
FIG. 3 is a cross-sectional view of a composite dielectric capacitor constructed according to the invention.

Referring now to FIG. 3, a cross-sectional diagram of a capacitor 102 constructed according to the invention is shown. Capacitor 102 has substrate 108, which is single crystal silicon n-type silicon, preferably having <100> orientation. Substrate 108, in the location of capacitor 102, or overall, may be originally of a dopant concentration, or may be implanted to have a desired n-type or p-type dopant concentration, as desired for the operation of the capacitor 102 (as described, for example, in U.S. Pat. No. 4,249,194 issued Feb. 3, 1981 and assigned to Texas Instruments Incorporated). A layer 109 of silicon nitride (Si$_3$N$_4$) overlays the surface of substrate 108 in the desired location, or overall as the case may be; an exemplary end thickness of layer 109 may be in the range of 7.5 nm to 10.0 nm. A layer 110 of silicon dioxide (SiO$_2$) overlays nitride layer 109; an exemplary thickness for layer 109 may be in the range of 4.0 to 6.0 nm. The layer of silicon dioxide may be thermal oxide, TEOS oxide, or formed by any other well-known technique; preferably oxide layer is formed by the oxidation of a portion of layer 109 as will be described below. A second layer 112 of silicon nitride (Si$_3$N$_4$) is disposed above oxide layer 110, with a thickness in the range, for example, of 7.5 nm to 10.0 nm. Gate electrode 114, formed of polycrystalline silicon, a refractory metal or metal silicide, aluminum or any other well-known gate material is disposed above nitride layer 112 to serve as the second plate of capacitor 102, the first plate being substrate 108.

Figure 1:
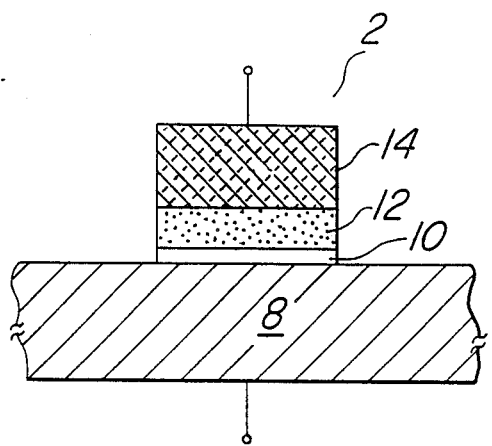
FIG. 1 is a cross-sectional view of a composite dielectric capacitor constructed according to the prior art.
Figure 2:
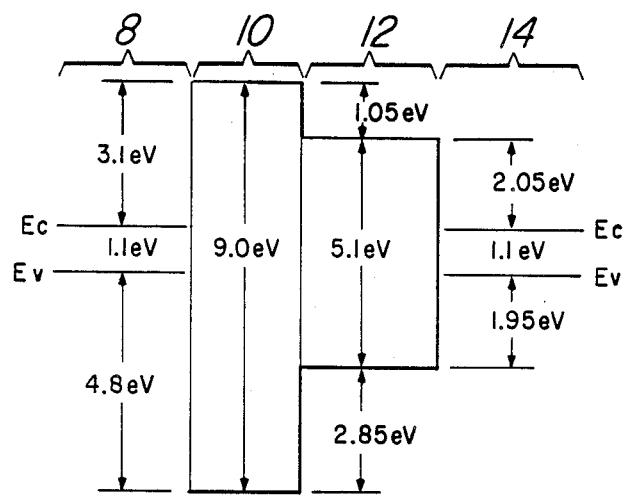
FIG. 2 is an energy band diagram for the capacitor of FIG. 1 constructed according to the prior art.
Figure 4:
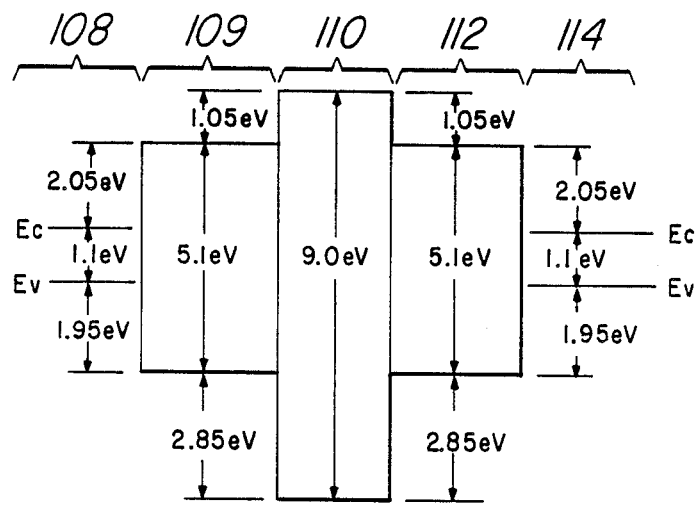
FIG. 4 is an energy band diagram for the capacitor of FIG. 3 constructed according to the invention.

FIG. 4 illustrates the energy band diagram for capacitor 102 according to the invention. FIG. 4 shows the energy bands for oxide layer 110 and nitride layer 112 similarly as in FIG. 2 for oxide layer 10 and nitride layer 12. Accordingly, in the same manner as capacitor 2 of FIGS. 1 and 2, the leakage of capacitor 102 in the bias condition where gate electrode 114 is at a negative potential relative to substrate 108 is much reduced over a capacitor having only a layer of silicon dioxide as the dielectric material.

However, capacitor 102 has nitride layer 109 underlying oxide layer 110. Accordingly, the energy band diagram of FIG. 4 is symmetric about oxide layer 110. In the condition where gate electrode 114 is positive relative to substrate 108, the electron source for dielectric leakage is substrate 108. As in the case of capacitor 2 of FIGS. 1 and 2, the high energy gap for silicon oxide layer 110 will block hole current, leaving electron current as the primary leakage mechanism. The presence of nitride layer 109 serves as a barrier to electrons sourced from substrate 108, though, in the same manner as nitride layer 112 serves as a tunneling barrier to electrons source from gate electrode 114. Accordingly, in the bias condition of gate electrode 114 being positive relative to substrate 108, the number of electrons reaching silicon dioxide layer 110 is much reduced over that for capacitor 2 of FIGS. 1 and 2, and over that of a capacitor having a single silicon dioxide dielectric layer. Since the number of electrons reaching silicon dioxide layer 110 is reduced, the number of electrons capable of tunneling through oxide layer 110 is also reduced, resulting in reduced leakage current from plate-to-plate of capacitor 108 of FIGS. 3 and 4.

An exemplary fabrication method for capacitor 102 of FIG. 3 begins with the provision of n-type substrate 108, having an orientation preferably of <100>. The thicknesses given herein will be by way of example only, and are not meant to be limiting in any sense. As mentioned above, the dopant concentration of substrate 108 is not critical to the invention, but may be of any desired level by way of selection of the starting material, or by way of ion implantation and diffusion. Substrate 108 receives a standard pre-furnace cleanup, such as by way of Megasonic agitation, followed by a hot nitric acid cleanup and a de-ionized water rinse. A wet etch deglaze in 10% HF can then be performed, if desired. Layer 109 of silicon nitride Si$_3$N$_4$ is then deposited by way of low pressure chemical vapor deposition (LPCVD) to a thickness of approximately 12.0 nm.

Immediately after the LPCVD of nitride layer 109, substrate 108 therewith is subjected to oxide growth in steam, for formation of oxide layer 110. An exemplary method for formation of oxide layer 110 is exposure of substrate 108 with nitride layer 109 in place in a furnace at 950 degrees Celsius, for five minutes in an argon environment, followed by ten minutes exposure to oxygen gas, followed by forty-six minutes of steam, followed by five minutes of argon. As a result, a portion of nitride layer 109 is oxidized, resulting in layer 110 of silicon dioxide approximately 5.0 nm thick, with silicon nitride layer 109 having a resulting thickness approximately 9.0 nm thick.

Silicon nitride Si$_3$N$_4$ layer 112 is then deposited by LPCVD over oxide layer 110 to a thickness of approximately 11.0 nm. Subsequent cleanup and LPCVD deposition of polycrystalline silicon to form gate electrode 114 is then performed according to conventional techniques. The polysilicon layer from which gate electrode 114 is formed may be phosphorous doped as desired. The polysilicon may then be patterned by way of conventional photolithography techniques, and etched to define gate electrode 114 as shown in FIG. 3. The underlying layers 109, 110 and 112 may also be etched with the same pattern as gate electrode 114, as desired. Subsequent processing to complete the integrated circuit into which capacitor 102 is to be incorporated now can follow.

For capacitor 108 constructed as described hereinabove, the electric field required to cause plate-to-plate leakage of approximately $10^{-4}$ amperes is approximately 50% greater than the field required to cause such leakage in a similarly sized capacitor having a single silicon dioxide layer as the capacitor dielectric. The symmetry of capacitor 108 so constructed is within 10% of the effective electric field value. It should be noted that, for a similarly constructed capacitor 2 of FIGS. 1 and 2, the leakage improvement is theoretically at the 50% improvement seen for capacitor 108 according to the invention for the negative bias condition, but would remain at the single silicon dioxide layer level for the positive bias condition.

Figure 5:
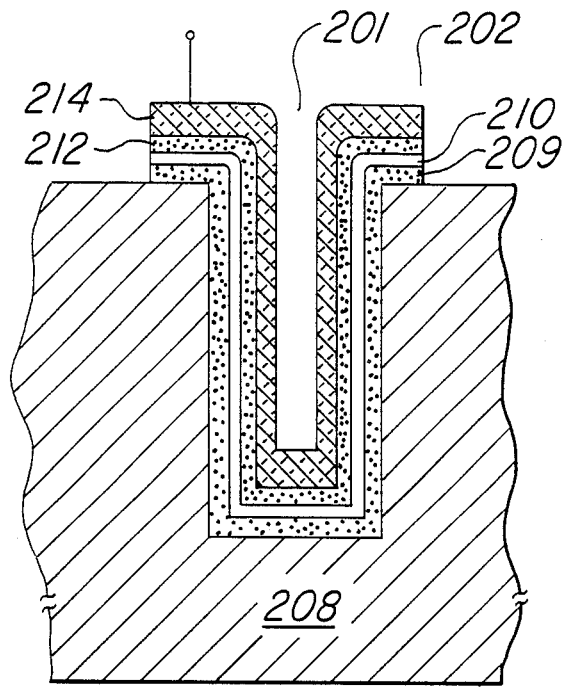
FIG. 5 a cross-sectional view of a composite dielectric capacitor constructed according to another embodiment of the invention.

It should be apparent, of course, that various configurations of capacitors having the nitride/oxide/nitride composite dielectric film may be constructed. Referring to FIG. 5, a trench capacitor 202 is illustrated, formed into a trench 201 which is etched into substrate 208 as is well known in the art. Along the sidewalls and bottom of trench 201 is $Si_3N_4$ layer 209, silicon dioxide layer 210, and $Si_3N_4$ layer 212, formed in a similar manner as described hereinabove for the planar capacitor 108 of FIG. 4 but disposed within trench 201. It should be noted that LPCVD silicon nitride is quite conformal when deposited, allowing trench capacitor 202 to be easily formed according to the instant invention; indeed, nitride layer 209 is likely to be substantially more uniform in thickness in trench 201 than a layer of silicon dioxide thermally grown in trench 201. Gate electrode 214 is then deposited within trench 201 as is well known in the trench formation art, to form capacitor 202.

Figure 6:
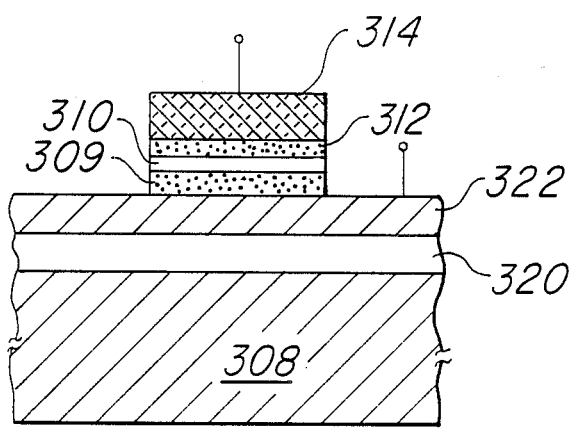
FIG. 6 is a cross-sectional view of a composite dielectric capacitor constructed according to another embodiment of the invention.

Referring now to FIG. 6, another embodiment of the capacitor according to the instant invention is illustrated. Capacitor 302 of FIG. 6 is formed on a silicon layer 322 which is isolated from substrate 308 by an insulating layer 320. Silicon layer 322 may be polycrystalline silicon, or may be single-crystal silicon which is recrystallized from the polycrystalline form, or in any other form known for forming silicon-on-insulator material. $Si_3N_4$ layer 309 is disposed above silicon layer 322, silicon dioxide layer 310 is disposed above nitride layer 309, and $Si_3N_4$ layer 312 is disposed above oxide layer 310 in the manner described hereinabove. Gate electrode 314 is then formed and patterned to form the second plate of capacitor 308.

An isolated capacitor may also be formed by the combination of the capacitor 302 of FIG. 6 disposed into a trench, as well as in a multitude of other configurations apparent to those of ordinary skill in the art.

As a result of the above structure for a capacitor dielectric, a capacitor may be formed with an enhanced dielectric constant over a single silicon dioxide layer and thereby with improved capacitance per unit area. Such a capacitor has improved leakage characteristics which are independent of the polarity of bias, and may be formed by using known process steps in the semiconductor art.

Although the invention has been described in detail herein with reference to its preferred embodiments, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

We claim:

1. A method for forming a capacitor at a surface of a semiconductor body, comprising the steps of:
   chemically vapor depositing a first layer of silicon nitride at said surface;
   forming a layer of silicon dioxide completely overlying said first layer of silicon nitride;
   forming a second layer of silicon nitride completely overlying said layer of silicon dioxide;
   forming a conductive capacitor plate completely overlying said second layer of silicon nitride and in direct contact therewith.

2. The method of claim 1, wherein said step of depositing said first layer of silicon nitride comprises low pressure chemical vapor deposition of silicon nitride.

3. The method of claim 1, wherein said step of forming said second layer of silicon nitride comprises low pressure chemical vapor deposition of silicon nitride.

4. The method of claim 1, wherein said step of forming said layer of silicon dioxide comprises oxidization of a portion of said first layer of silicon nitride.

5. The method of claim 1, further comprising:
   forming a trench at said surface prior to said step of forming said first layer of silicon nitride.

6. A method for forming a capacitor at a surface of a semiconductor body, comprising:
   forming an insulating layer at said surface;
   forming a semiconductor layer over said insulating layer
   after said step of forming a semiconductor layer, depositing a first layer of silicon nitride at said surface;
   forming a layer of silicon dioxide overlying said first layer of silicon nitride;
   forming a second layer of silicon nitride overlying said layer of silicon dioxide; and
   forming a capacitor plate overlying said second layer of silicon nitride.

7. The method of claim 6 wherein said step of depositing said first layer of silicon nitride comprises low pressure chemical vapor deposition of silicon nitride.

8. The method of claim 6, wherein said step of forming said second layer of silicon nitride comprises low pressure chemical vapor deposition of silicon nitride.

9. The method of claim 6, wherein said step of forming said layer of silicon dioxide comprises oxidization of a portion of said first layer of silicon nitride.

* * * * *